United States Patent [19]

Thurmond et al.

[11] 4,088,835

[45] May 9, 1978

[54] COMPREHENSIVE FEEDBACK ELIMINATION SYSTEM EMPLOYING NOTCH FILTER

[75] Inventors: George R. Thurmond, Austin, Tex.; Harro K. Heinz, Deerfield, Ill.

[73] Assignee: Rauland-Borg Corporation, by said Harro K. Heinz

[21] Appl. No.: 766,439

[22] Filed: Feb. 7, 1977

[51] Int. Cl.[2] .................... H03J 5/24

[52] U.S. Cl. .................... 179/1 FS; 179/1 AT

[58] Field of Search .................... 179/1 AT, 1 D, 1 FS, 179/1 A

[56] References Cited

U.S. PATENT DOCUMENTS

| | | | |
|---|---|---|---|
| 3,183,304 | 5/1965 | Schroeder | 179/1 FS |
| 3,256,391 | 6/1966 | Boner | 179/1 FS |
| 3,752,928 | 8/1973 | Flickinger | 179/1 D |
| 3,755,749 | 8/1973 | Van Ryswyk | 179/1 FS |
| 3,789,143 | 1/1974 | Blackmer | 179/1 VL |
| 3,991,272 | 11/1976 | Tarr | 179/1 VL |
| 4,002,994 | 1/1977 | Fender | 179/1 D |

*Primary Examiner*—Kathleen H. Claffy

*Assistant Examiner*—E. S. Kemeny

*Attorney, Agent, or Firm*—Leydig, Voit, Osann, Mayer & Holt, Ltd.

[57] ABSTRACT

A feedback elimination apparatus for a sound system which employs a notch filter assembly comprising a plurality of active notch filters, each capable of producing a narrow notch in the frequency characteristic of the system. Means are provided for temporarily switching each notch filter to an oscillating mode to produce a reference signal at notch frequency which, for adjustment purposes, is zero beat with an acoustic feedback signal in the system, so the feedback signal is canceled when the notch filter is returned to its normal mode. A compressor is temporarily interposed in the sound system for limiting and controlling the level of the acoustic feedback signal to facilitate separation of acoustic feedback signals of different frequency and to prevent overload. An equalizer is also interposed in the system and which, in addition to performing its equalization function, is capable of producing a relatively wide notch in the frequency characteristic of the system for canceling the points of acoustical feedback grouped in frequency.

10 Claims, 3 Drawing Figures

COMPREHENSIVE FEEDBACK ELIMINATION SYSTEM EMPLOYING NOTCH FILTER

In co-pending application Ser. No. 756,135, which is included by reference, there is disclosed a notch filter assembly for canceling separate acoustic feedback signals in a sound system. In the simplified apparatus there disclosed, a notch filter in the form of an operational amplifier having a resonant feedback network is connected in a loop circuit which is coupled to the system for producing an auxiliary sharply peaked signal. Such signal is inverted and fed back into the system to produce a narrow notch on the order of 1/20 octave in the frequency characteristic curve of the system. To align the notch with the offending feedback signal, the gain control of the system is advanced gradually to a point where acoustic feedback is noted, that is, where the system begins to "ring" or "squeal". The loop circuit is then temporarily switched to an oscillating mode to produce a reference signal at notch frequency, and the frequency of the resonant network is varied to produce a condition of zero beat, following which the loop circuit is returned to its normal mode, with the depth of the notch being increased to the point where the feedback signal is completely canceled.

The system gain is then further increased by a small increment to cause the system again to "squeal," this time at a different frequency, and the procedure is repeated using a second notch filter. The steps are further repeated using additional notch filters as long as points of acoustic feedback exist.

Unfortunately there are a number of practical problems involved in the above. In the first place the procedure requires intentionally placing the system in a violently unstable "squealing" mode, not only once but repeatedly. This not only runs risk of imposing a severe overload on the speakers and amplifiers, but the resulting sound level is highly unpleasant and disconcerting. The operator, wishing to minimize the hazards of overload and the discomfort of those present, tends to become hurried and tense in carrying out the adjustment. Even more importantly, however, the points of squealing often do not occur in smooth progression upon incremental change in system gain. The first "squeal" of a series may be at a single and well defined frequency but, upon cancellation thereof, followed by an increase in system gain, the additional "squeals" will often be clustered and difficult to separate for individual treatment. Indeed, squealing at one frequency where the gain is solely under manual control tends to induce simultaneous squealing at other, related and unrelated, frequencies. A further problem is the fact that the total number of points of acoustic feedback may be high, especially where clustered, and there may not be available sufficient individual notch filters to accommodate each of them.

In accordance with the present invention it has been found that the above problems can be overcome and a number of additional advantages may be achieved by employing, in combination with the notch filter assembly of the type described, a volume compressor and a bandpass equalizer. The compressor is a known type of device for preventing excessive sound levels, not simply by clipping the maximum amplitude of the wave, which induces distortion, but by limitation of maximum amplitude as a result of compression of the dynamic range. The use of the compressor not only prevents development of high sound levels under feedback conditions, thus protecting both ears and equipment, but it is found that the compressor makes possible convenient separation of "squeals" of different frequency, so that the same can be individually treated by adjustment of respective notch filters. By inclusion of a ⅓ octave band pass equalizer in the system several complementary functions are performed: With preliminary adjustment of the equalizer as described herein, the total number of points of acoustic feedback may be sharply reduced. Moreover, the band pass equalizer may be adjusted to identify acoustic feedback signals and to cancel them out, particularly where signals are clustered in frequency, thereby making it possible to "get by" with a reduced number of notch filters, resulting in a sound system which is capable of use in difficult circumstances and which is, at the same time, very economical.

It is, accordingly, an object of the present invention to provide a comprehensive anti-feedback circuit and procedure which is capable of taking care of problems of acoustic feedback quickly and simply with a high degree of effectiveness and free of certain practical problems which may arise in a simplified system employing active notch filters alone.

It is a more specific object to provide anti-feedback circuitry and apparatus which is readily capable of coping with a number of offending frequencies and which is easily adjustable for cancellation of signals at each of the frequencies in quick and orderly succession. In this connection it is an object to provide anti-feedback apparatus and procedure which may be universally employed in rooms and halls intended for various purposes including theatres, churches, concert halls, school auditoriums and the like and which is, indeed, capable of being adjusted without risk or discomfort by any person, even a school child, with a minimum of instruction, and using a minimum of test equipment.

It is a more specific object of the invention to provide anti-feedback apparatus which is compatible with any existing sound equipment, which is highly reliable and largely fail safe and which entails no risk whatsoever of damaging the equipment with which it is used. It is a more specific object, in this connection, to provide anti-feedback apparatus and procedure which intentionally places the sound system in a "squealing" mode for purposes of adjustment to a condition of cancellation but in which there is insurance that the "squeal" will be automatically maintained at a sufficiently low and controlled level as to insure listening comfort and complete freedom from overload, enabling adjustment to be performed in a more relaxed and orderly way.

It is still another object of the present invention to provide a comprehensive anti-feedback arrangement employing a combination of tunable active notch filters and fixed active band pass filters but which is able to accommodate a large number of points of acoustic feedback, particularly where such points of acoustic feedback are closely related in frequency, i.e. exist in clusters, with the points of feedback first being identified using the notch filters and with subsequent transfer to the equalizer for correction by cancellation.

Other objects and advantages of the invention will become apparent upon reading the attached detailed description and upon reference to the drawings in which.

While the invention has been described in connection with a preferred embodiment, it will be understood that we do not intend to limit the invention to the embodiment shown but intend, on the contrary, to cover all of the various alternative and equivalent circuits included within the spirit and scope of the appended claims.

Figure 1:
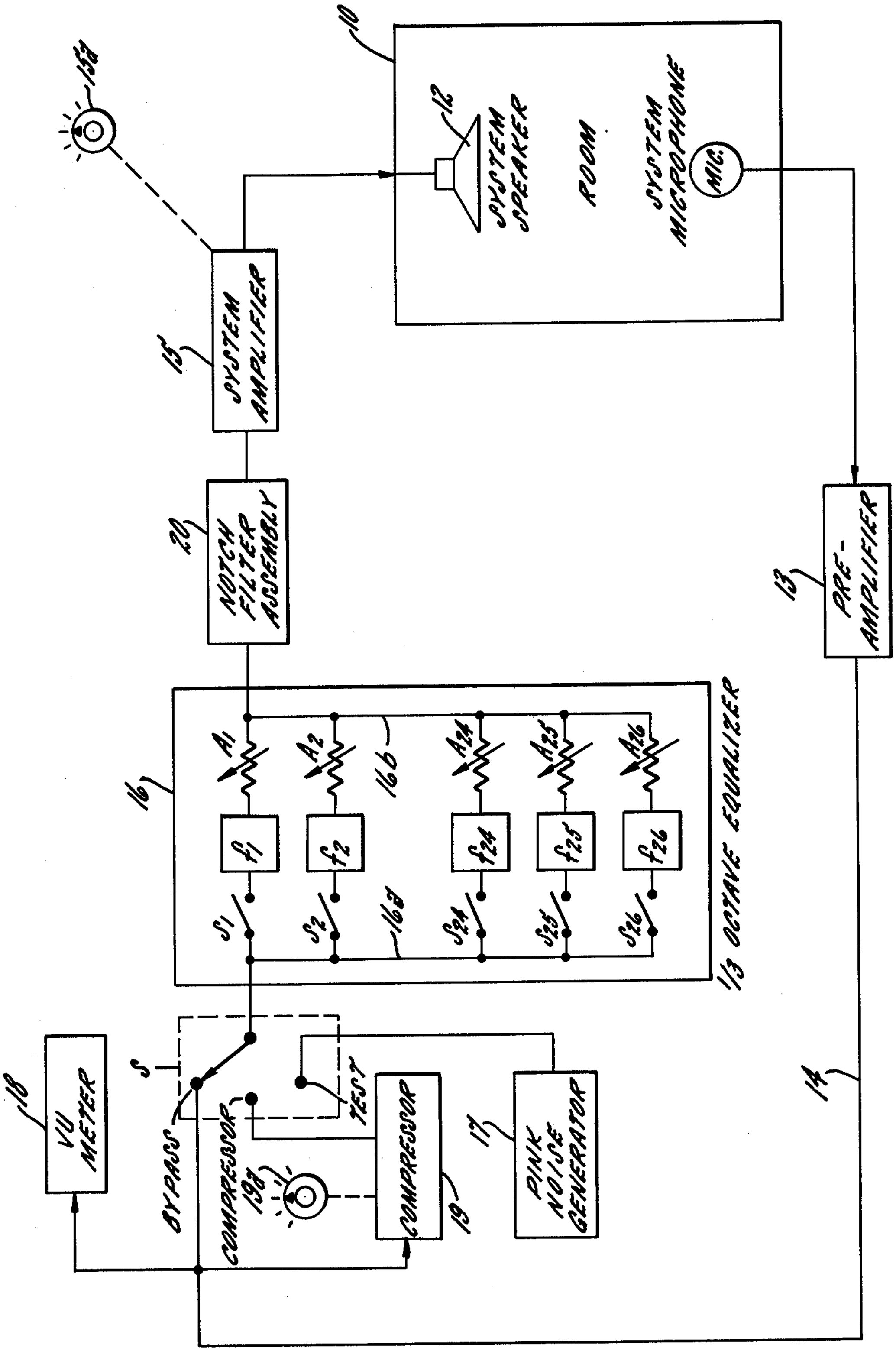
FIG. 1 shows a typical sound system employing a comprehensive anti-feedback arrangement in accordance with the present invention.

Turning now to the drawings there is shown in FIG. 1 a typical sound system for an auditorium diagrammatically indicated at 10 having a microphone 11 and one or more loud speakers 12. The signal from the microphone is amplified by a preamplifier 13 which is connected to a line 14 feeding a system amplifier 15, the system amplifier being equipped with the usual gain or level control 15*a*.

Connected in series with the line 14 is an equalizer 16. The equalizer is preferably of the type having a set of active band pass filters F1-F26 which are connected in parallel across input and output busses 16*a*, 16*b*. The filters F1-F26 cover the audio spectrum in overlapped relation, and each of the filters has the same width, expressed as a fraction of an octave, nominally ⅓ octave. Each filter may be cut in and out of the circuit by a corresponding switch S1-S26 and each of the filters is separately adjustable by respective attenuators A1-A26. An example of a commercially available equalizer is that identified as Model 6226 ⅓ Octave Equalizer sold by Rauland-Borg Corporation, Chicago, Illinois 60618. However, the invention is not limited thereto and includes usage of an equalizer having 20 parallel-connected ½ octave filters identified as Model 6101*a* or even an equalizer having 9 parallel-connected one-octave filters identified as Model 6209.

For the purpose of adjusting the equalizer 16, thereby to preliminarily "equalize" the system, a "pink noise" generator 17 is provided as a source of test signal, with the response level of the system being measured by a VU meter 18. The "pink noise" generator, per se well known in the art, is a wide spectrum noise source in which the noise energy in each octave is the same.

In equalizing the system, a switch S is provided having a "test" position in which the output of the "pink noise" generator 17 is fed directly to the input buss 16*a* of the equalizer 16. The switches associated with each of the band pass filters F1-F26 are closed one at a time and in sequence, and the associated one of the attenuation controls A1-A26 is adjusted to give the same reference reading on the meter 18. Such adjustment insures that each channel of the equalizer is equally favorable to the transmission of sound in the system. Following individual setting of all of the stages to reference level on the VU meter, all of the switches S1-S26 are closed, and the equalizer is left connected in the system during normal operation.

In carrying out the present invention we further include, in the system line 14, a compressor 19. The compressor is a device which is per se well known for reducing the dynamic range of the signal which passes through it thereby limiting the maximum signal to a predetermined safe level without clipping. The compressor 19 has a control 19*a* for varying the degree of compressive effect. The pink noise generator 17, VU meter 18 and compressor 19 are commercially available as a unit under catalog identification Model 6200 Test Set from the aforementioned Rauland-Borg Corporation. As will be seen, the compressor 19 not only limits each successive acoustic feedback signal, during adjustment, to a safe and comfortable level, but it also functions to separate concurrent feedback signals occurring at different frequencies thereby to enable separate and orderly treatment.

Figure 2:
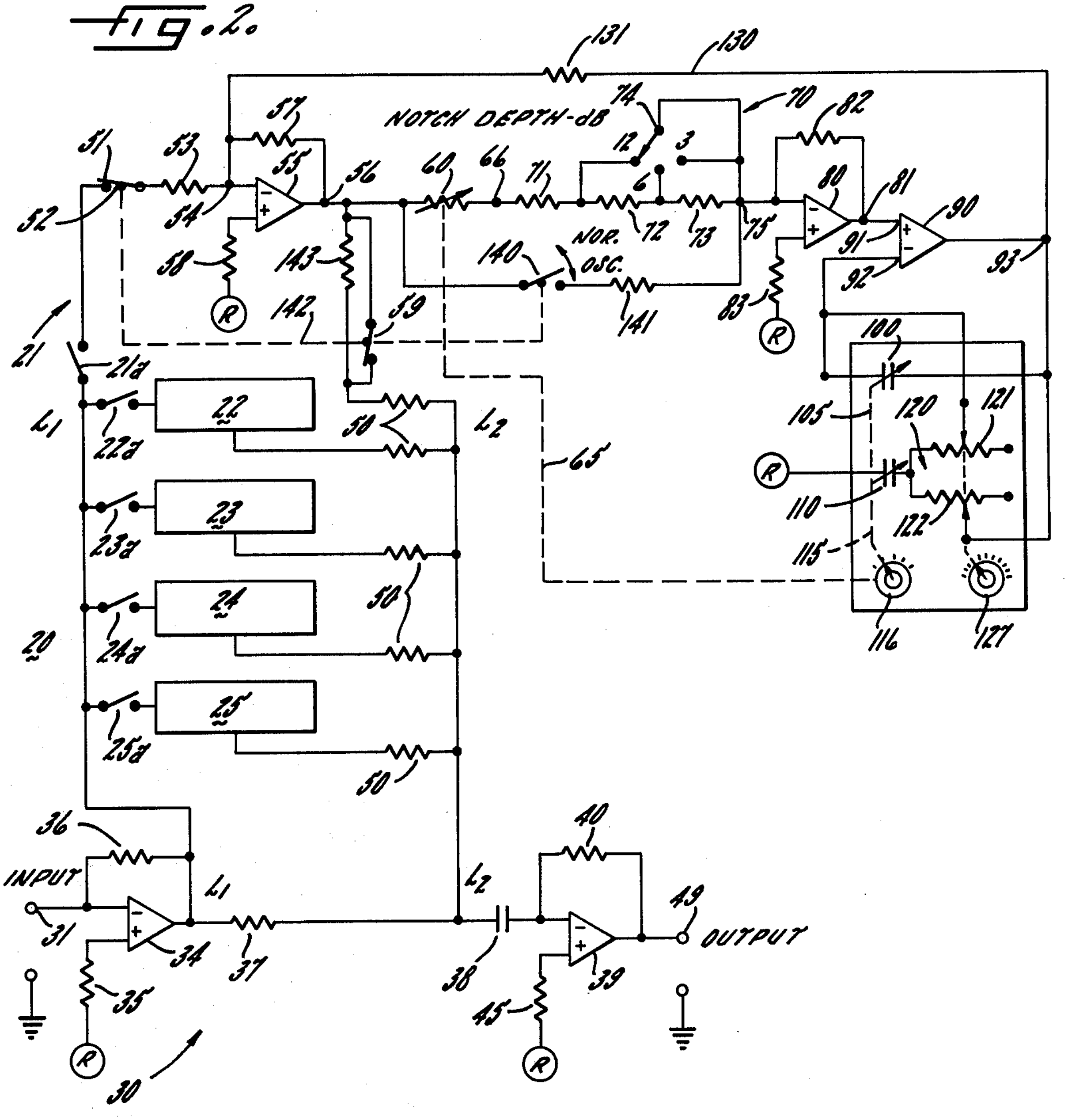
FIG. 2 is a simplified circuit diagram of the notch filter assembly employed in FIG. 1.

As a further element of the present system there is provided, in series with line 14, a notch filter assembly 20 having a plurality of notch filters of the active type connected in parallel and each of which is capable of feeding into the system a peaked auxiliary signal at an offending frequency, but in an inverted phase relation, thereby to establish a narrow notch in the frequency characteristic curve of the system, aligned with the acoustical feedback signal for effectively canceling the same. Referring to FIG. 2, and to FIG. 3 which is in greater detail, it will be seen that the assembly 20 includes a total of five active notch filters indicated at 21–25 having enabling switches shown, for example, at 21*a*–25*a*. The circuit of filter 21 has been illustrated in full, and it will be understood that the filters 22–25 are identical thereto but capable of separate adjustment to permit cancellation of offending feedback signals at a total of five different frequencies.

The assembly 20 has a "straight through" or "buss" circuit 30 having an input terminal 31 connected via a capacitor 32 and resistor 33 to a first operational amplifier 34. The amplifier has a second, or reference, input terminal which is connected via a resistor 35 to a point of voltage reference "R". A feedback resistor 36 is connected across the amplifier input and output terminals. The amplifier 34 is in the form of a commercially available integrated circuit preferably of the type 741. Connected to the output of the amplifier 34 is a series resistor 37 which forms one leg of a voltage divider, or summing circuit. The ends of the resistor are respectively connected to a loop input line L1 and a summing buss L2. The summing buss is coupled, by means of a capacitor 38, to the input of a second operational amplifier 39 having a feedback network generally indicated at 40. Such network is shown in greater detail in FIG. 3 as being made up of resistors 41, 42 and capacitors 43, 44. A resistor 45 connected to the second input terminal leads to the point of reference R. The output circuit is completed by a network consisting of capacitors 46, a series resistor 47 and capacitor 48, leading to an output terminal 49. The operational amplifier 39 is preferably of the type commercially designated 1709. Both the input operational amplifier 34 and the output amplifier 39 are of wide band configuration and connected, as indicated by the polarity, to produce a 180° inversion of the signal, so that the signal at the output terminal 49, as a result of the double inversion, is in phase with the signal at the input.

It is to be especially noted that the notch filters 21–25 are all parallel-connected to the summing buss L2 through individual summing resistors 50.

Turning next to the circuit of the notch filter 21, taken as representative, at the top of FIGS. 2 and 3, it includes an input terminal 51 which is connected via a normally closed switch 52 (to which reference will later be made) to an input resistor 53 which is connected, in turn, to the input connection 54 of an operational amplifier 55 which may be of type 741. The operational amplifier has an output terminal 56, a negative feedback path being provided via a resistor 57 to the input terminal 54. A resistor 58 leads to the point of reference R.

The circuit to the summing buss L2 is completed through a normally closed switch 59 and summing resistor 50. The operational amplifier 55 is preferably of the type EC-0022.

From the amplifier output terminal 56, the circuit continues through a variable resistor 60. As shown in FIG. 3, the resistor 60 is made up of four sections 61–64 selectable by a tap switch 65 having an output terminal 66 and a drive connection. Next interposed in the circuit is a notch depth network 70 having resistors 71, 72, 73 which are selectable by a tap switch 74, the network having an output terminal 75.

Fed by terminal 75 is an operational amplifier 80, preferably of the type 741, having an output terminal 81 which is coupled, via a negative feedback resistor 82, to terminal 75. A resistor 83 leads to the reference point R.

Both of the operational amplifiers 55, 80 are connected to invert the signal. Because of the double inversion the signal at terminal 81 is in phase with the signal appearing at input terminal 51.

In accordance with the present invention, the amplifier circuit in the notch filter is connected in a loop, the loop including an operational amplifier having a resonant feedback network which is adjustable in frequency so that in the normal mode an auxiliary, or cancellation, signal at the resonant frequency is applied out-of-phase to the summing buss thereby to establish a narrow notch in the frequency characteristic curve of the system. Means are also provided for temporarily switching the notch filter into an oscillating mode in which it oscillates at notch frequency for establishing a reference signal which may be smoothly swept into zero beat relation with an acoustic feedback signal in the system. Consequently, when the notch filter is restored to its normal mode, the notch is aligned with the acoustic feedback signal so that the acoustic feedback is canceled.

Figure 3:
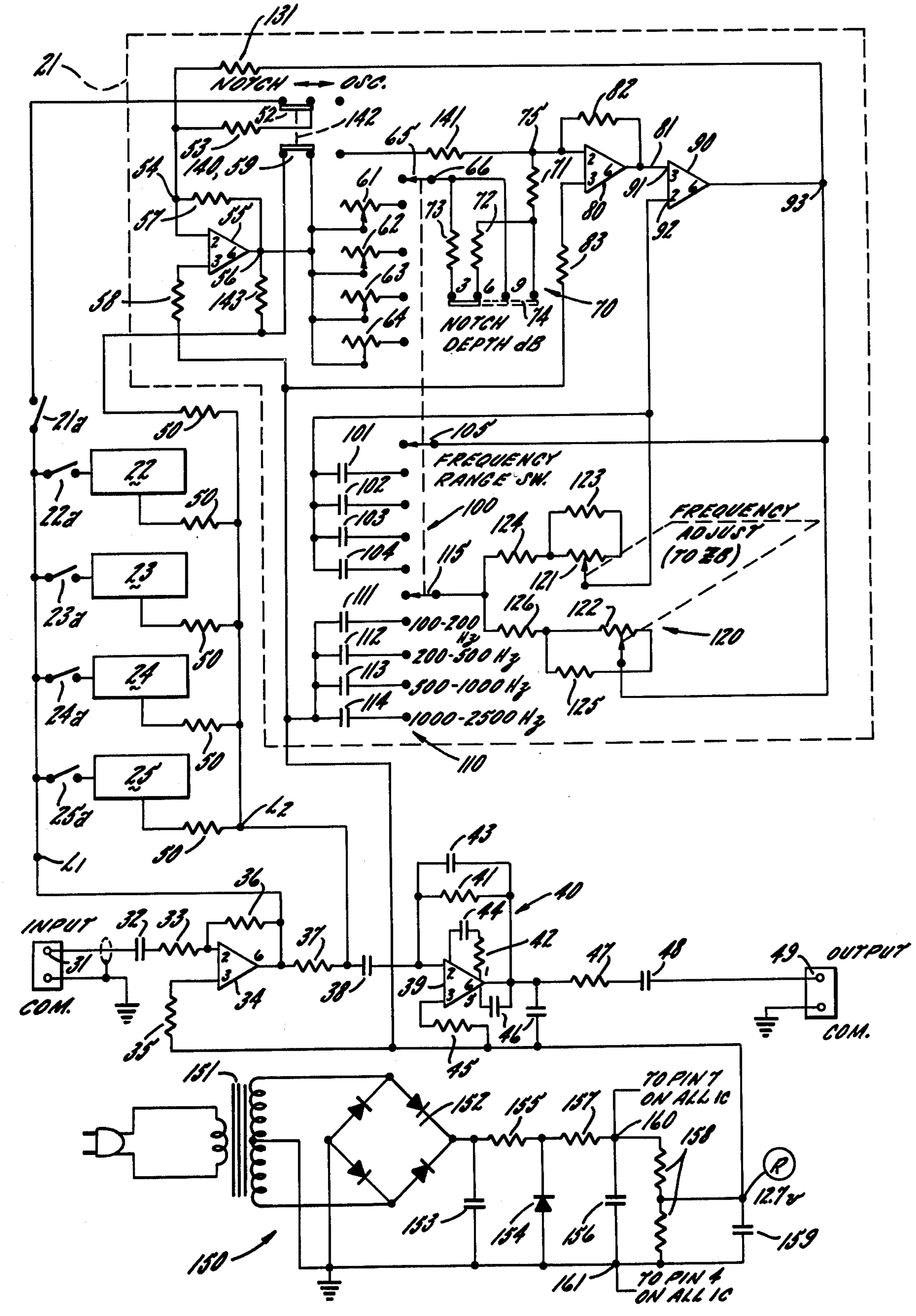
FIG. 3 is a more complete circuit diagram showing the details of the resonant feedback network and including the associated power supply.

Thus, referring to both FIGS. 2 and 3, an operational amplifier 90 is provided, preferably of the type 741, having a direct input terminal 91 and an inverted input terminal 92 as well as an output terminal 93. The feedback network includes a variable capacitor 100 having sections 101–104 controlled by a tap switch 105. The network further includes a variable capacitor 110 having sections 111–114 controlled by a tap switch 115. The common lead of the capacitor 110 is returned to reference point R.

The three tap switches 65, 105 and 115 are all connected to a common manual tap switch control 116. The capacitors 101–104 and 111–114 are calibrated to produce resonance at stepped frequencies over the feedback-susceptible portion of the audio range lying between 100 Hz. and 2500 Hz. The frequency range is preferably divided as follows: 100–200 Hz., 200–500 Hz., 500–1000 Hz. and 1000–2000 Hz. If desired a further range of 2500 Hz. to 5000 Hz. may be provided.

In carrying out the present invention a manual control is, in addition, provided for smoothly and steplessly sweeping the resonant frequency of the network between the steps of the tapped control so as to achieve a zero beat condition with an acoustic feedback signal. This is achieved by a variable resistance network 120 having ganged potentiometers 121, 122 with associated fixed resistors 123, 124 and 125, 126. The variable resistors are brought out to a manual control knob 127. Thus it is possible by a combination of stepped and smoothly variable adjustment to approach, for zero beating, any frequency within the available range.

For the purpose of completing the amplifier loop, indicated at 130, a resistor 131 is connected from the output terminal 93 of the resonant operational amplifier 90 to the input terminal 54 of the operational amplifier 55. In accordance with one of the aspects of the present invention, the resistance in the loop circuit is compensatingly varied as a function of the range of frequency selected by the tap switch control knob 116. In the present instance this is accomplished by tap switch 65 which, moved by its drive connection, switches into the circuit the appropriate one of the resistors 61–64. This maintains the size of the notch at reference level in each of the frequency bands and makes the notch depth independent of frequency. The width of the notch is determined by the Q of the circuit. It is found that a Q is readily obtainable, using active filters, to produce a notch of optimum width, which is considered to be 1/20 octave, and even narrower widths are obtainable. The term "sharply peaked" as used herein refers to a band width on the order of 1/20 octave.

The operation of the notch loop circuit 21 as thus far described may be summarized as follows: The audio signal in the basic system, and which is picked up on line L1 at the output of the operational amplifier 34, is applied to the input terminal 54 of a first inverting amplifier 55 in the loop circuit. The amplified signal, subject to attenuation in the series resistors 60, 70 is further amplified and re-inverted by the second operational amplifier 80 to produce an amplified, in-phase output signal at terminal 81. Such signal, fed to the input terminal 91 of the resonant, non-inverting operational amplifier 90, is amplified and appears at output terminal 93. The capacitor networks 100, 110 and resistor network 120 are so chosen that the negative feedback signal, which is fed back from the output 93 to the inverted input terminal 92 can be blocked at any frequency within the feedback-susceptible portion of the audio range, that is, at any frequency lying between the limits of 100 Hz. and 2500 Hz. The result is to produce a sharply defined peak in the frequency characteristic of the loop 130 at the frequency established by the tap switch 116 and variable control 127.

However, in carrying out the present invention the signal which is derived from the notch loop circuit is not the signal as directly produced across the operational amplifier 90 but is the inversion of such signal which is taken from across the inverting amplifier 55. Thus the signal which is derived from the loop circuit, and which is applied via the voltage dividing resistor 50 to the summing buss L2, is in the form of a narrow peak in the characteristic which, applied to the signal in the system in an out-of-phase relation, produces a notch in the frequency characteristic curve of the system.

In accordance with one of the important features of the present invention, means are provided for causing the loop circuit 130, which includes the resonant operational amplifier 90, to oscillate at the resonant, or notch, frequency to produce a reference signal which is capable of being adjusted into zero beat relation with an acoustic feedback signal in the system for thereby adjusting the notch frequency into canceling relation. This is accomplished, in the present system by providing sufficient gain in the amplifiers of the loop to achieve oscillation, by normally including sufficient series resistance so as to defeat oscillation, and by intentionally, and temporarily, shunting the series resistance so that oscillation is induced. Thus there is provided a shunting switch for shunting the series resistance networks 60, 70 with a resistor having a sufficiently low value as to reduce the total loop resistance to the point of oscillation. The shunting switch, indicated at 140, and which is preferably of the pushbutton type, connects an auxiliary shunting resistor 141 directly between the output terminal 56 of the amplifier 55 and the input terminal 75 of the amplifier 80, the shunting resistor typically having a resistance on the order of 13,000 ohms.

In accordance with one aspect of the invention, means are provided for decoupling the loop circuit from the system in order to reduce the amplitude of the reference signal to a level which is more nearly that of the acoustic feedback signal. Such decoupling is accomplished by employing a gang switch including sections 52, 59 which are mechanically connected to the shunting switch 140 by a link 142. Thus when the switch 140 is closed, switches 52, 59 are both simultaneously opened. The switch 52 disconnects the loop circuit from the input line L1, while the opening of the switch 59 inserts in series with L2 a high value coupling resistor 143. The oscillation of the loop circuit, coupled to the summing buss by the resistor 143, produces an audible sine wave reference signal in the system which can be distinguished from the offending acoustic feedback signal. By stepping the frequency selector control 116, the reference signal can be brought into the approximate frequency range of the acoustic feedback signal. By subsequent manual rotation of the variable frequency control 127, the reference signal can be smoothly swept into zero beat condition with the acoustic feedback signal, thereby signalling that the notch is in a condition of alignment with the feedback signal and that frequency adjustment is complete. Note that the frequency adjustment may be completed without any actual knowledge or measurement of the frequency of the offending wave. When zero beat has been attained, the shunting switch 140 may be released to restore it to its normal open condition, cutting off the oscillation, and with the accompanying closing of switches 52, 59 causing the loop circuit to be fully recoupled to the lines L1, L2 for producing an aligned notch in the frequency response curve.

For the sake of completeness, reference may be made to a typical power supply which may be used in connection with the above described circuitry, and which is indicated at 150 in FIG. 3. The power supply includes a transformer 151 having a bridge rectifier 152 and a filter capacitor 153. Voltage regulation is provided by means of a zener diode 154 having a dropping resistor 155, and final filtering is provided by a capacitor 156 having an associated resistor 157. A voltage divider 158, the lower portion of which is shunted by a capacitor 159, provides reference voltage for terminals R of the various operational amplifiers. The upper and lower terminals 160, 161 provide voltage for pins 7 and 4 of the operational amplifiers.

While the above description of the circuit, and the functions it is intended to perform, taken in connection with the available data on the cross-referenced commercial amplifiers, provides sufficient information for one skilled in the art to practice the invention, the following circuit values, keyed to the reference numerals, may be considered representative:

| | | | |
|---|---|---|---|
| 32 | 0.22 μf. | 37 | 68K ohm. |
| 33 | 100K ohm. | 38 | 1.5 μf. |
| 34 | Type 741 op. amp. | 39 | Type 1709 op. amp. |
| 35 | 1K ohm. | 41 | 430K ohm. |

-continued

| | | | |
|---|---|---|---|
| 36 | 27K ohm. | 42 | 1.5K ohm. |
| 43 | 15 pf. | 104 | 820 pf. |
| 44 | 820 pf. | 111 | 0.10 μf. |
| 45 | 1K ohm. | 112 | 0.047 μf. |
| 46 | 30 and 220 pf. | 113 | 0.018 μf. |
| 47 | 56 ohm. | 114 | 0.0282 μf. |
| 48 | 47 μf. | 121 | 50K ohm. |
| 50 | 100K ohm. | 122 | 50K ohm. |
| 53 | 100K ohm. | 123 | 120K ohm. |
| 55 | Type 741 op. amp. | 124 | 20K ohm. |
| 57 | 10K ohm. | 125 | 120K ohm. |
| 58 | 10K ohm. | 126 | 20K ohm. |
| 61-64 | 50K ohm. | 131 | 120K ohm. |
| 71 | 4.7K ohm. | 141 | 13K ohm. |
| 72 | 360 ohm. | 143 | 3.3M ohm. |
| 73 | 750 ohm. | 153 | 1000 μf. |
| 80 | Type 741 op. amp. | 154 | IN53618 |
| 82 | 10K ohm. | 155 | 220 ohm. |
| 83 | 10K ohm. | 156 | 1000 μf. |
| 90 | Type 741 op. amp. | 157 | 100 ohm. |
| 101 | 0.01 μf. | 158 | 10K, 11K ohm. |
| 102 | 0.0047 μf. | 159 | 33 μf. |
| 103 | 0.0018 μf. | | |

OPERATION OF TOTAL SYSTEM

With the operation of the notch filter 21 of the notch filter assembly 20 (FIGS. 2 and 3) in mind, attention may be given to the features and advantages of the total system shown in FIG. 1. This can be most readily done by reviewing a typical system adjustment routine.

With the notch filter assembly 20 bypassed and hence inactive, and with all of the switches in the equalizer 16 in open condition, the switch S is switched to the "test" position thereby switching the "pink noise" generator 17 into the circuit as the sound source. With the system gain control 15_a_ at an intermediate position, the first switch, S1, of the equalizer is closed, thereby to establish a rushing noise in the system speaker which is picked up by the microphone and preamplified to produce a reading at the VU meter 18. The attenuator A1 is advanced to increase the reading of the VU meter to an up-scale "reference" level.

The switch S1 of the equalizer is then opened and the switch S2 is closed to activate the second pass band in the equalizer. The attenuation control A2 is then rotated to bring the VU meter, again, to reference level. This procedure is repeated successively in all of the other pass bands of the equalizer, following which all of the switches S1-S26 are closed resulting in a system which amplifies at an equal energy level in each ⅓ octave region of the frequency spectrum.

Following the initial equalization the selector switch S is switched to the "compressor" setting and the compressor control 19_a_, if one is provided, is set in the upper portion of its compression range. The system gain control 15_a_ is then advanced to a level which causes the system to break into acoustic feedback. The feedback, instead of being loud and uncontrolled, is at a safe and more comfortable listening level in accordance with the setting of the compression ratio control 19_a_. Where a Model 6200 Test Set is used, an optimized, fixed compression ratio is available for use if desired. In any event, using just the apparatus set forth in FIG. 1, all of the following steps may then be carried on in an orderly and relaxed fashion:

Switch 21_a_ is closed to activate the notch filter 21, the notch depth switch 74 is placed in its 3dB position, and the push button switch 140 thereof is pressed to place such notch filter in the oscillating mode. This produces a second low level "squeal" in the system which is brought into zero beat with the acoustic feedback signal by successive operation of the coarse and fine frequency controls 116, 127. When the push button 140 is released, restoring the filter circuit to the notch mode, the original acoustic feedback signal should have disappeared. If it is still audible, the notch depth switch is advanced to its 6dB position and, if necessary, to the 12dB position touching up the frequency control 127 if necessary. This completes cancellation adjustment for the initial acoustic "squeal".

The system gain control is then incrementally advanced, resulting in a second acoustic feedback signal at a different frequency. Switch **22*a* is closed to activate the second notch filter 22, and the process is repeated, again resulting in cancellation of the offending signal. The system gain is then still further increased until the system again breaks out into acoustic feedback at still another frequency. Switch 23*a* is closed to activate the notch filter 23, and the adjusting procedure is again repeated. The same procedure is used in connection with notch filters 24, 25**.

After all five of the notch filters have been activated and adjusted, the controls 116, 127 thereof should be checked for duplication. It is possible that with the successive increase in system gain the system may break out in acoustic feedback a second time at the same frequency. If duplication is noted the notch depth in one of the notch filters may be increased and the redundant notch filter may be deactivated.

It is found that the compressor 19, in addition to protecting the equipment in the system and the ears of those present, performs the novel function of assisting in separation of acoustic feedback signals which tend to occur simultaneously upon incremental increase in system gain. The notch filter when used alone in an audio system is theoretically capable of disposing of offending frequencies one by one, but where the system breaks into acoustic feedback simultaneously on two or more frequencies, frequency adjustment, by zero beating, becomes more difficult requiring an element of skill and experience. It will suffice to say that where the compressor 19 is incorporated in the system in combination with a notch filter assembly 20, feedback signals tend to occur singly, rather than in combination, upon making incremental changes in system gain, so that there are no more than two audible signals present which may, by adjustment of controls 116, 127 be readily brought into zero beat relation, even by a school child with minimum instruction and a minimum of skill and experience, in an orderly fashion, and without risk of damaging the system.

It is one of the features of the present system and procedure that the number of notch filters may be limited to a reasonable number, for example five, even though more than five points of acoustic feedback are encountered.

Let us assume, for example, that the operator having successively activated and adjusted notch filters 21–25 finds, upon further increasing the system gain, that feedback signals at additional frequencies appear. Where more than five offending frequencies are present, experience shows that they usually occur in one or more closely spaced clusters. Thus upon noting the settings of controls 116, 127 it may be found that several of the notch filters have been adjusted, not identically, but to a cluster of frequencies which are close to one another, and which may, indeed, fall into the same ⅓ octave region. In such situation the clustered notch filters are all de-activated and the corresponding attenuation control A1-A26 in the ⅓ octave equalizer is adjusted to provide sufficient attenuation, in effect substituting one relatively wide notch in the system characteristic for a closely spaced series of narrow notches. Alternatively, where the cluster does not fall neatly within a ⅓ octave range, the attenuation may be increased in two adjacent ones of the band pass filters of the equalizer, still further broadening the notch of cancellation. This "frees up" one or more of the notch filters 21–25 for cancellation of points of acoustic feedback which are relatively isolated and not part of a cluster.

As a result of the combination of the equalizer 16 and notch filter assembly 20 it is usually not necessary to include, in the filter assembly, more than five individual notch filters for overall system economy. It will be apparent, however, that the system may be elaborated by including an additional notch filter assembly 20 in series with the first to provide a total of ten sharply defined notches, with any clustered overflow being accommodated by adjusting the attenuation in the appropriate band pass filter of the equalizer.

It is apparent that the objects of the invention have been amply fulfilled. The notch filter assembly 20 along with the equalizer, compressor, noise generator and indicator, may be added to any existing amplification system without exception and without having to modify any of the components; thus the benefits of the invention are available at modest cost. It is not necessary to carry a large unused inventory of filters, and all of the active filter elements including noise generator and indicator may be left connected and therefore available for readjustment at a later time by any non-professional person authorized to operate the system.

It will be apparent that the feedback elimination apparatus amply fulfills the objects set forth above, permitting each successively produced acoustic feedback signal to be identified and cancelled out by temporarily placing a notch filter in an oscillating mode with subsequent adjustment to zero beat, thereby making unnecessary any actual measurement of the frequencies of the respective feedback signals. The system and procedure not only simplify the initial adjustment by dispensing entirely with any measuring equipment, but also make it practical for a system operator, even one with limited skill or experience, to quickly run through the adjusting steps whenever desired for confirmatory purposes or for "touch-up" whenever a minor change is made in the acoustical environment as, for example, the shifting or addition of loudspeakers, shifting of microphone position, or the like.

However, quite apart from the inherent capability of the apparatus in cancelling acoustic feedback signals is its continuing reliability under practical conditions, particularly considering the fact that active filters are employed which are relatively complex, consisting of a large number of interdependent elements, each of which is a candidate for possible failure. Where a plurality of active notch filters are employed in series relation, as has been proposed in the past, failure of any of the individual notch filters results in failure of the system, whereas where the individual notch filters and the individual ⅓ octave filters in the equalizer are all connected in parallel as taught in the present invention, conventional types of failure are not capable of disabling the system, but result only in the failure of the individual filter section which is usually unnoticeable and which, in any event, may be compensated for by a downward gain adjustment of the system until the offending one of the filters can be replaced. The system employing the present invention is therefore almost entirely "fail-safe" regardless of the degree of sophistication, i.e. complexity, of the circuits employed in the individual notch filters and band pass filters.

Moreover, by connecting all of the active filters in parallel both in the notch and in the band pass filter the noise generated by components within the filters is substantially reduced. The reason for this is that each active filter is capable of contributing noise only over its active narrow frequency range. Not only is the noise reduced, but the system signal, by reason of the use of the particular filters and their interconnections there is a minimum of phase shift. This is particularly notable, considering the large total number of filters interposed in the system and is to be contrasted with the use of series-connected filters where multiple filters often introduce a cumulative phase shift which can be of troublesome magnitude.

In the preferred form of the invention the network which feeds back a signal from the output terminal 93 of operational amplifier 90 to the inverted input terminal 92, and which has been referred to as a "resonant" network, consists entirely of capacitors 100, 110 and resistors 120. The effect of the network is to produce a negative feedback signal at all audio frequencies except a narrow band of frequencies, having a width on the order of 1/20 octave, with the result that a sharply defined peak is formed in the frequency characteristic, the peak being inverted to form a notch in the characteristic curve. The use of resistors and capacitors solely for this purpose is desirable since such components can be produced at less cost than inductances. However, it will be understood that the term "resonant feedback network" is not limited to a circuit employing resistors and capacitors but includes any network, for example, a parallel-connected LC circuit which exhibits a high impedance in the feedback loop at the selected frequency.

Also it will be understood that reference to "cancellation" of an acoustic feedback signal by incorporating an aligned notch in the system characteristic curve is used to facilitate understanding of the invention. What is being referred to is the "effective cancellation" of the acoustic feedback signal resulting from the reduction in gain, by reason of the notch, at the frequency of the feedback signal to the point that oscillation of the system at such frequency cannot occur.

While the term "audible" has been used to describe the reference signal which is created for zero beating purposes, and while it is convenient to adjust to zero beat by ear, it will be understood that the invention is not limited thereto and coincidence may be indicated, if desired, on an oscilloscope or other suitable device. The term "resonant" as applied to the feed-back network includes circuitry which, in combination with components in the associated operational amplifier, is frequency selective for the purpose set forth. The term "inverting" refers to relative inversion. The term "cancellation" refers to substantial cancellation. While it is convenient to reduce series resistance for the purpose of temporarily increasing gain to bring about oscillation of the loop circuit, the term "increasing gain" will be understood to be a general term applied to means for securing oscillation at the resonant (notch) frequency. In the preferred embodiment of the invention three amplifiers are included in the loop, but this does not preclude the possibility of using a different number connected so as to be capable of performing the recited function.

The above description has emphasized use of the notch filter in identification of feedback frequencies. However, since each band pass filter of the equalizer 16 can be switched off individually, causing the system to have very low gain in the corresponding ⅓ octave band pass, the equalizer itself constitutes a convenient means for identifying feedback of frequencies.

Also, while the above description has emphasized placing each notch filter in an oscillating state at notch frequency to generate a reference signal for direct alignment (by zerobeating) with the feedback signal, it will be apparent to one skilled in the art that the invention in its broader aspects is not limited thereto and includes equivalent means for achieving alignment, as set forth, for example, in the above copending application, provided that parallel-connected filters of the band pass type are exclusively employed in both the notch filters and the equalizer.

What is claimed is:

1. In a sound system including a microphone, a preamplifier, a system amplifier and loudspeaker, means for eliminating acoustical feedback comprising a band pass equalizer interposed in the system adjustable for substantially equalized response across the audio spectrum, a notch filter assembly having a summing buss for receiving a system signal and a plurality of active notch filters connected in parallel to said summing buss, each of the notch filters having a loop amplifier circuit including an operational amplifier with a resonant feedback circuit so arranged that an out-of-phase signal with respect to the system signal at the resonant frequency is applied to the summing buss thereby to establish a notch in the frequency characteristic curve of the system, means for manually increasing the gain of the system to the point of generating an acoustic feedback signal for use during an equalization procedure, a compressor temporarily interposed in the system during the equalization procedure for limiting the acoustic feedback signal to a safe and comfortable level, each of the notch filters having temporarily energizable means for causing the notch filter to oscillate at notch frequency thereby to produce an audible reference signal, means including a manual control in each notch filter for smoothly varying the frequency of the resonant network thereby sweeping the frequency of the reference signal over the feedback-susceptible portion of the audio range for establishing a zero beat relation with the acoustic feedback signal to align the notch with the acoustic feedback signal, each notch filter having manual control means for increasing the level of the out-of-phase signal thereby deepening the notch to the point where the acoustic feedback signal is effectively canceled.

2. The combination as claimed in claim 1 in which the band pass equalizer includes a series of parallelconnected band pass filters at stepped frequencies extending over the audio spectrum and having substantially equal width expressed as a fraction of an octave, each of the filters having means for varying the attenuating effect thereof.

3. The combination as claimed in claim 2 in which each of the notch filters is capable of establishing a notch in the frequency characteristic curve of the system having a width of approximately 1/20 octave and in which each of the band pass filters is capable of producing a notch in the frequency characteristic curve of the system having a width substantially greater than 1/20 octave.

4. In a sound system including a microphone, a preamplifier, a system amplifier and loudspeaker, means for elminating acoustical feedback comprising a band pass equalizer interposed in the system for substantially equalized response across the audio spectrum, a notch filter assembly having a summing buss connected to receive a system signal and a plurality of active notch filters connected in parallel to the summing buss, each of the notch filters having a loop amplifier circuit including an operational amplifier with a resonant feedback circuit so arranged that an out-of-phase signal with respect to the system signal peaked at the resonant frequency is applied to the summing buss thereby to establish a narrow notch in the frequency characteristic curve of the system, means for manually increasing the gain of the system to the point of generating an acoustic feedback signal for use during an equalization procedure, means temporarily interposed in the system during the equalization procedure for limiting the acoustic feedback signal to a safe and comfortable level, each of the notch filters having temporarily energizable means for causing the notch filter to oscillate at notch frequency thereby to produce an audible reference signal, means including a manual control in each notch filter for smoothly varying the frequency of the resonant network thereby sweeping the frequency of the reference signal over the feedback-susceptible portion of the audio range for establishing a zero beat relation with the acoustic feedback signal to align the narrow notch with the acoustic feedback signal, each notch filter having manual control means for increasing the level of the out-of-phase signal thereby deepening the notch to the point where the acoustic feedback signal is entirely canceled, the equalizer having ⅓ octave overlapping pass bands separately adjustable to vary attenuating effect for producing a relatively wide notch in the characteristic curve of the system for effective cancellation of an entire group of acoustic feedback signals spaced closely in frequency.

5. In a sound system including a microphone, a preamplifier, a system amplifier and loudspeaker, means for eliminating acoustical feedback comprising a notch filter assembly having a summing buss connected to receive a system signal and a plurality of active notch filters connected in parallel to the summing buss, each of the notch filters having a loop amplifier circuit including an operational amplifier with a resonant feedback circuit so arranged that an out-of-phase signal with respect to the system signal peaked at the resonant frequency is applied to the summing buss thereby to establish a notch in the frequency characteristic curve of the system, manual means for incrementally increasing the gain of the system to the point of generating an acoustic feedback signal for use during an equalization procedure, a compressor temporarily interposed in the system during the equalization procedure tending to permit an acoustic feedback signal to occur at only a single frequency and for limiting such acoustic feedback signal to a safe and comfortable audio level, each of the notch filters having temporarily energizable means for causing the notch filter to oscillate at notch frequency thereby to produce and audible reference signal, means including a manual control in each notch filter for smoothly varying the frequency of the resonant network thereby sweeping the frequency of the reference signal over the feedback-susceptible portion of the audio range for establishing a zero beat relation with the acoustic feedback signal to align the notch with the acoustic feedback signal, each notch filter having manual control means for increasing the level of the out-of-phase signal thereby deepening the notch to the point where the acoustic feedback signal is effectively canceled.

6. The method of removing acoustic feedback signals in a sound system having a microphone, amplifier, gain control, and band pass equalizer, which comprises providing operational amplifiers each having a resonant loop circuit for selectively amplifying the signal in the system to produce an auxiliary signal which has a sharply peaked frequency characteristic, adjusting the band pass equalizer for substantially equalized response of the system across the audio spectrum, inserting a compressor in the system for compressing the dynamic range of the amplified signal, increasing the gain of the system until a first acoustic feedback signal is produced, setting the compressor so that the acoustic feedback signal is limited to a safe and comfortable level, and then following an adjusting procedure including the steps of (1) temporarily increasing the gain in one of the loop circuits so that the circuit oscillates at the resonant frequency to produce an audible reference signal, (2) varying the resonant frequency smoothly to bring the reference signal to zero beat with the acoustic feedback signal, (3) applying the auxiliary signal to the system in relatively inverted relation to produce a notch in the frequency characteristic curve of the system at the frequency of the acoustic feedback signal for cancellation of the feedback signal, and (4) incrementally increasing the gain of the system so that a separate acoustic feedback signal is produced, repeating the adjusting steps in the respective loop circuits for each successively produced acoustic feedback signal until all of the separate acoustic feedback signals have been disposed of, and removing the compressor from the system.

7. In a sound system including a microphone, a preamplifier, a system amplifier and loudspeaker, means for eliminating acoustical feedback comprising a band pass equalizer interposed in the system adjustable for substantially equalized response across the audio spectrum, a notch filter assembly having a summing buss connected to receive a system signal and plurality of active notch filters connected to the summing buss, each of the notch filters having a loop amplifier circuit including an operational amplifier with a resonant feedback circuit so arranged that an out-of-phase signal with respect to the system signal at the resonant frequency is applied to the summing buss thereby to establish a notch in the frequency characteristic curve of the system, means for manually increasing the gain of the system to the point of generating an acoustic feedback signal for use during an equalization procedure, a compressor temporarily interposed in the system during the equalization procedure for limiting the acoustic feedback signal to a safe and comfortable level, each of the notch filters having temporarily energizable means for causing the notch filter to oscillate at notch frequency thereby to produce an audible reference signal, means including a manual control in each notch filter for smoothly varying the frequency of the resonant network thereby sweeping the frequency of the reference signal over the feedback-susceptible portion of the audio range for establishing a zero beat relation with the acoustic feedback signal to align the notch with the acoustic feedback signal, each notch filter having manual control means for increasing the level of the out-of-phase signal thereby deepening the notch to the point where the acoustic feedback signal is effectively canceled, the active notch filters being connected in parallel with the summing buss and the band pass equalizer being formed of parallel-connected band pass filters, the parallel connections of the filters serving to preserve the phase of the signal thereby precluding cumulative phase error.

8. In a sound system including a microphone, a preamplifier, a system amplifier and loudspeaker, means for eliminating acoustical feedback comprising a band pass equalizer interposed in the system for substantially equalized response across the audio spectrum, a notch filter assembly having a summing buss for receiving a system signal and a plurality of active notch filters connected in parallel to the summing buss, each of the notch filters having a loop amplifier circuit including an operational amplifier with a resonant feedback circuit so arranged that an out-of-phase signal with respect to the system signal peaked at the resonant frequency is applied to the summing buss thereby to establish a narrow notch in the frequency characteristic curve of the system, means for manually increasing the gain of the system to the point of generating an acoustic feedback signal for use during an equalization procedure, means temporarily interposed in the system during the equalization procedure for limiting an acoustic feedback signal to a safe and comfortable level, each of the notch filters having means for producing a reference signal at notch frequency, means including a manual control in each notch filter for smoothly varying the frequency of the resonant network thereby sweeping the frequency of the reference signal over the feedback-susceptible portion of the audio range to align the notch with the frequency of the acoustic feedback signal, each notch filter having manual control means for increasing the level of the out-of-phase signal thereby deepening the notch to the point where the acoustic feedback signal is entirely canceled, the equalizer having overlapping pass bands of at least about ⅓ octave in width separately adjustable to vary the attenuating effect for producing a relatively wide notch in the characteristic curve of the system for effective cancellation of an entire group of acoustic feedback signals spaced closely in frequency.

9. In a sound system including a microphone, a preamplifier, a system amplifier and loudspeaker, means for eliminating acoustical feedback comprising a notch filter assembly having a summing buss for receiving a system signal and a plurality of active notch filters connected in parallel to the summing buss, each of the notch filters having a loop amplifier circuit including an operational amplifier with a resonant feedback circuit so arranged that an out-of-phase signal with respect to the system signal peaked at the resonant frequency is applied to the summing buss thereby to establish a notch in the frequency characteristic curve of the system, manual means for incrementally increasing the gain of the system to the point of generating an acoustic feedback signal for use during an equalization procedure, a compressor temporarily interposed in the system during the equalization procedure tending to permit an acoustic feedback signal to occur at only a single frequency and for limiting such acoustic feedback signal to a safe and comfortable audio level, each of the notch filters having means for producing a reference signal at notch frequency, means including a manual control in each notch filter for smoothly varying the frequency of the resonant network thereby sweeping the frequency of the reference signal over the feedback-susceptible portion of the audio range to align the notch with the frequency of the acoustic feedback signal, each notch filter having manual control means for increasing the level of the out-of-phase signal thereby deepening the notch to the point where the acoustic feedback signal is effectively canceled.

10. In a sound system including a microphone, a preamplifier, a system amplifier and loudspeaker, means for eliminating acoustical feedback comprising a band pass equalizer interposed in the system adjustable for substantially equalized response across the audio spectrum, a notch filter assembly having a summing buss for receiving a system signal and a plurality of active notch filters connected to the summing buss, each of the notch filters having a loop amplifier circuit including an operational amplifier with a resonant feedback circuit so arranged that an out-of-phase signal with respect to the system signal at the resonant frequency is applied to the summing buss thereby to establish a notch in the frequency characteristic curve of the system, means for manually increasing the gain of the system to the point of generating an acoustic feedback signal for use during an equalization procedure, a compressor temporarily interposed in the system during the equalization procedure for limiting an acoustic feedback signal to a safe and comfortable level, each of the notch filters having means for producing a reference signal at notch frequency, means including a manual control in each notch filter for smoothly varying the frequency of the resonant network thereby sweeping the frequency of the reference signal over the feedback-susceptible portion of the audio range to align the notch with the frequency of the acoustic feedback signal, each notch filter having manual control means for increasing the level of the out-of-phase signal thereby deepening the notch to the point where the acoustic feedback signal is effectively canceled, the active notch filters being connected in parallel with the summing buss and the band pass equalizer being formed of parallel-connected band pass filters, the parallel connections of the filters serving to preserve the phase of the signal thereby precluding cumulative phase error.

* * * * *